(12) United States Patent
Berberich et al.

(10) Patent No.: US 6,297,981 B1
(45) Date of Patent: Oct. 2, 2001

(54) COMPACT ELECTRICAL DEVICE, ESPECIALLY A SWITCHED-MODE POWER SUPPLY

(75) Inventors: Reinhold Berberich, Frankfurt am Main; Dietmar Schultz, Bad Homburg, both of (DE)

(73) Assignee: Mannesmann VDO AG, Frankfurt (DE)

( * ) Notice: Subject to any disclaimer, the term of this patent is extended or adjusted under 35 U.S.C. 154(b) by 0 days.

(21) Appl. No.: 09/656,301

(22) Filed: Sep. 6, 2000

(30) Foreign Application Priority Data

Sep. 14, 1999 (DE) .............................. 199 43 873
Aug. 7, 2000 (DE) .............................. 100 39 110

(51) Int. Cl.$^7$ .................................................. H02M 1/00
(52) U.S. Cl. ............................................................ 363/144
(58) Field of Search .................................. 363/144, 146; 361/707, 679, 713, 728, 748

(56) References Cited

U.S. PATENT DOCUMENTS

| | | | |
|---|---|---|---|
| 4,800,479 | * | 1/1989 | Bupp ...................................... 363/48 |
| 4,903,120 | * | 2/1990 | Beene et al. ........................... 357/74 |
| 4,943,844 | * | 7/1990 | Oscilowski et al. ................... 357/74 |
| 5,309,130 | * | 5/1994 | Lint ........................................ 336/65 |
| 5,942,795 | * | 8/1999 | Hoang .................................. 257/692 |
| 5,973,923 | * | 10/1999 | Jitaru .................................... 361/704 |
| 6,091,611 | * | 7/2000 | Lanni ..................................... 363/21 |
| 6,122,087 | * | 4/2001 | Grant et al. .......................... 366/144 |

* cited by examiner

Primary Examiner—Adolf Deneke Berhane
(74) Attorney, Agent, or Firm—Martin A. Farber

(57) ABSTRACT

The invention relates to A compact electrical device, especially a switched-mode power supply, comprising a transformer for matching different electrical voltages, and an electrical circuit and a plug-in device, which can be connected to a reference voltage, at least one primary winding of the transformer being connected to the plug-in device and at least one secondary winding of the transformer being connected to the electrical circuit via conductor tracks, the primary and secondary windings enclosing at least a part of a transformer core. In a compact electrical device which provides for reduction in the assembly expenditure and, nevertheless, operates reliably, the primary and the secondary windings (3) are arranged jointly with the conductor tracks (2) and/or the plug-in device (4, 5) in a carrier body (1) made of insulating material, the primary and secondary windings (3) being insulated from one another by the material of the carrier body (1) and the electrical circuit arranged on a planar carrier element being connected to the conductor tracks (2) of the carrier body (1) via an electrical connection.

33 Claims, 6 Drawing Sheets

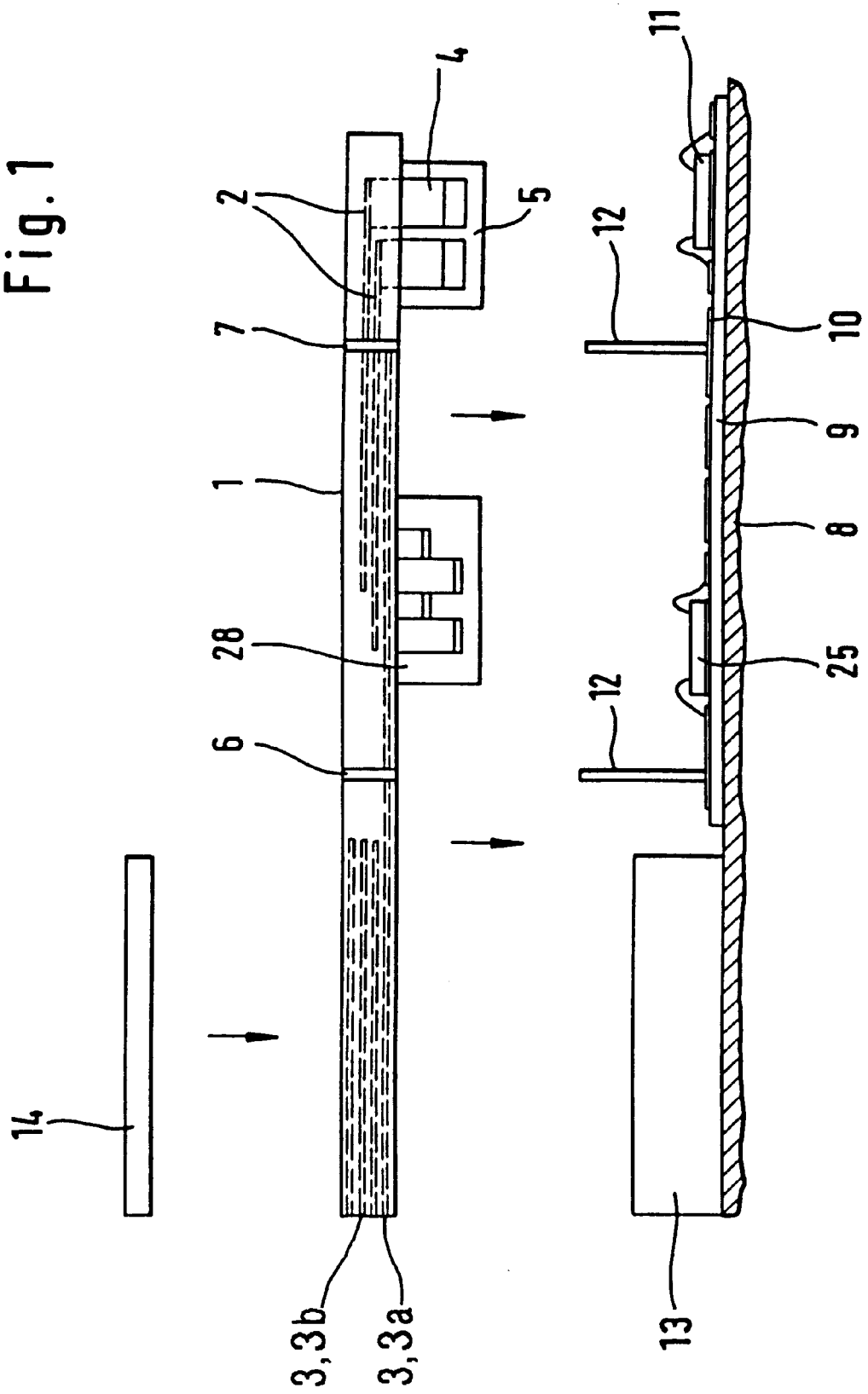

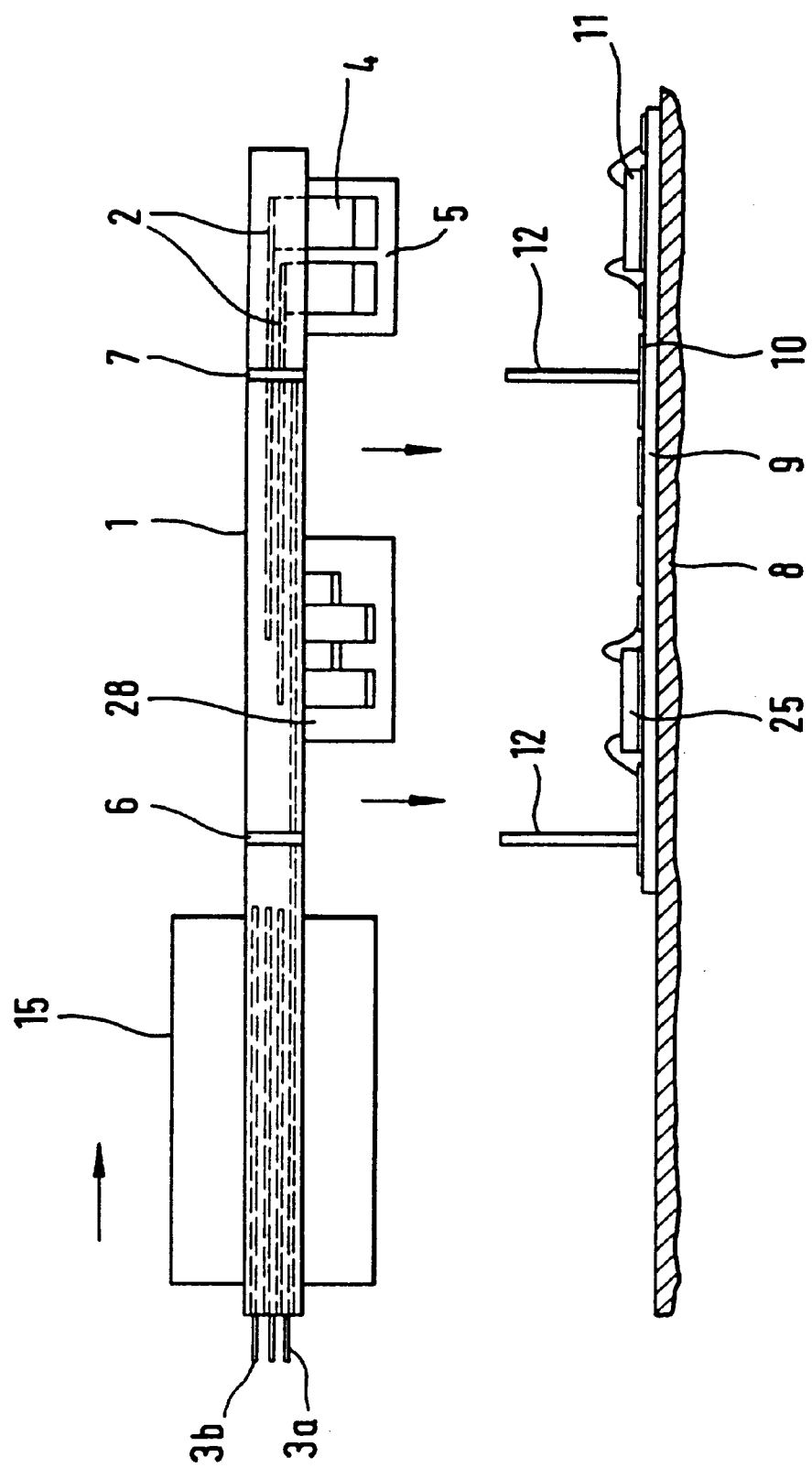

COMPACT ELECTRICAL DEVICE, ESPECIALLY A SWITCHED-MODE POWER SUPPLY

FIELD AND BACKGROUND OF THE INVENTION

The invention relates to a compact electrical device, especially a switched-mode power supply, comprising at least one inductance and one contacting device which can be connected to the reference voltage, the inductance being connected to the contacting device via a first electrically conductive connection.

Matching voltages between different electrical networks in a motor vehicle requires an electrical transformer which can be manufactured inexpensively and has the smallest possible constructional volume.

Known devices consist of a number of individual components. The electronic circuit board, power semiconductor with heat sink, transformer and cabling are typical standard components occurring in such devices. These numerous individual components increase the assembly costs which has a cost-increasing effect especially when large numbers of such devices are produced. In addition to the winding of the transformer, the many individual connections between the assemblies, in particular, represent a considerable time factor.

SUMMARY OF THE INVENTION

The invention is thus based on the object of specifying an electrical device which makes it possible to reduce the assembly expenditure and, nevertheless, operates reliably.

According to the invention, the object is achieved in that the inductance and/or the first electrically conductive connection and/or the contacting device are arranged at least partially in a carrier body made of insulating material and are insulated from one another by the material of the carrier body, an electrical circuit being connected to the first electrically conductive connection of the carrier body via a second electrically conductive connection.

The advantage of the invention consists in that different electrical components are combined to form a mechanically connected unit which results in mechanical stability of the device. This greatly reduces the production expenditure and the manufacturing costs of the electrical device. Such an electronic block contains all necessary electrical conductor tracks which are kept insulated from one another either by temporary spacers or genuine insulating layers and are subsequently sprayed with plastic. Apart from the reduction in process steps, this results in an improvement in the electrical characteristics with respect to the insulation. In addition, these compact electronics are shock resistant and have vibration-reducing properties which is of advantage, in particular when used in motor vehicles.

Advantageously, two inductances arranged on the carrier body are constructed as transformer for matching different electrical voltages between the electrical circuit and the contacting device, the first electrical connections connecting the primary windings of the transformer to the contacting device and the secondary winding of the transformer to the electrical circuit, the primary and the secondary windings enclosing at least a part of a transformer core.

As an alternative, the object of the invention is achieved in that the transformer core and/or the first electrically conductive connections and/or the contacting device are arranged in a carrier body consisting of insulating material, the first electrical connections being insulated from one another by the material of the carrier body and the primary and secondary windings of the transformer being arranged on a planar carrier element carrying the electrical circuit, in such a manner that the transformer core is enclosed by the windings and a second electrically conductive connection is connected, to the first electrical connection of the carrier body.

In this arrangement, too, the individual components of plug, power supply/distribution and the transformer windings and, respectively, the transformer core are arranged together in one compact constructional unit and have the advantages already explained.

In one embodiment, at least one contact pin is arranged on the carrier element for connecting the electrical circuit to at least one conductor track of the carrier body, which protrudes into an opening electrically connected to the at least one conductor track, for forming the second electrically conductive connection.

This arrangement of the rigid pin implements the electrical connection between. the electrical circuit and the electrically conductive parts of the carrier body simply by plugging the carrier body onto the contact pin as a result of which, at the same time, mechanical locking is achieved.

This electrical connection can be produced in a particularly simple manner if the contact pin for producing the electrical connection is pressed into the opening of the carrier body. This makes it possible to generate not only an electrical connection but also a permanent mechanical connection which is insensitive to vibrations.

In another embodiment, the ends of the first electrical connection constructed as conductor track are brought out of the opening of the carrier body, protruding beyond the latter, and are soldered jointly with the contact pin brought through the opening. If, at the same time, separate electrical components such as electrolytic capacitors or choke coils are arranged on the carrier body, they can be attached to the carrier body in one soldering process together with the soldering of the contact pin. This also applies to additional circuit boards with wired components which can also be mounted in the same soldering process.

The conductor tracks can he produced in a particularly simple manner if they are constructed as shaped sheet-metal parts. The carrier body can be produced in a simple manner as an injection-molded part with the aid of such punched bent sheet-metal parts which are stacked on top of one another and form the electrical conductor tracks in the carrier body.

The ends of the shaped sheet-metal parts, which are preferably angled away, are advantageously brought out of the carrier body for forming the electrical connections of the plug device. The body of the contacting device is formed by the carrier body in this arrangement.

In a further development of the invention, the carrier body is constructed for the later accommodation of further electrical and/or electronic components. In particular, it exhibits a receptacle provided with latching devices for a further component.

Thus, cased or uncased electronic components can be advantageously arranged on the outside of the carrier body.

The compact electrical block can be fashioned in the same plastic injection process in such a manner that the carrier body is a component of a housing which covers the electrical circuit of the supporting carrier element.

In this arrangement, the carrier body exhibits a peripheral angled-away collar which rests on the carrier element, a seal, which is also peripheral, being integrally molded to the collar.

In another embodiment, the carrier body is constructed as center part of the housing with an integrally molded-on seal on one side for resting on the carrier element, the center part of the housing being closed with a planar cover which also has an integrally molded seal which rests on the center part of the housing.

To remove the lost heat, the carrier element is manufactured out of metal, preferably aluminum and is used at the same time to dissipate heat from the power components.

To improve the thermal characteristics, it is provided in a further development of the invention that the carrier element carries a substrate which consists of copper applied to thermally conductive ceramics (direct copper bonding). The very good thermal conductivity of this material enables the power transistors to have high powers.

A simplified assembly of the switched-mode power supply is possible if the transformer core is constructed of two parts, a first E-like core element resting on the carrier element, its three webs, pointing perpendicularly away from the carrier element, reaching through corresponding transformer openings in the carrier body and a second planar or E-like core element covering the webs and magnetically connecting them to one another, the primary and secondary windings being arranged to loop around between the webs.

Due to the fact that the first core element rests on the carrier element constructed as heat sink, the transformer can be operated at high power and can have a high efficiency. In this arrangement, the transformer operates reliably at the high currents occurring in modern motor vehicles and can be cooled without problems.

In a further development, the primary and secondary windings of the transformer protrude from the carrier body in a laterally interrupted manner, the one-piece transformer core, which has an eight-like cross section, being pushed over the interrupted primary and secondary windings, the primary and secondary windings being electrically closed by means of welding or soldering after the transformer core has been pushed on.

In a particularly simple embodiment, the primary and secondary windings are electrically closed by means of a push-on carrier bodes end part which contains conductor tracks adapted to the windings.

The primary and secondary windings of the transformer are arranged in parallel with the planar carrier element in this arrangement.

BRIEF DESCRIPTION OF THE DRAWINGS

The invention permits numerous embodiments. One of these will be explained in greater detail with reference to the drawings shown in the figures, in which FIG. 1 shows a first embodiment of the solution according to the invention, FIG. 2 shows a second embodiment of the solution according to the invention.

DETAILED DESCRIPTION OF THE PREFERRED EMBODIMENT

Figure 3A:
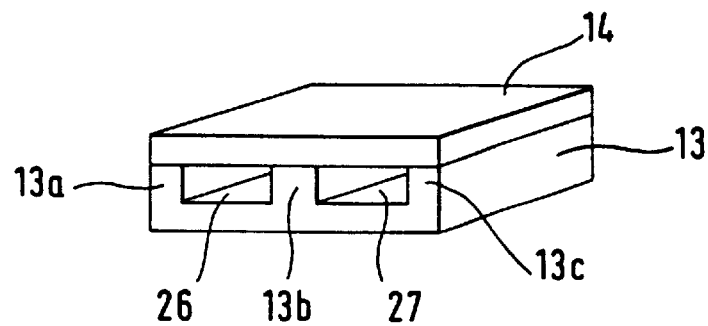
FIGS. 3a and 3b show embodiments of the transformer core.

Identical features are marked by identical reference symbols.

FIG. 1 shows a switched-mode power supply used for matching different voltage levels in numerous electrical devices. A carrier body 1 made of plastic contains a number of conductor tracks 2 which are stacked on top of one another and which are constructed as punched bent sheet-metal plates. The conductor tracks 2 are arranged inside the plastic carrier body 1 in such a manner that the plastic between the conductor tracks 2 has an insulating effect. In addition, the carrier body 1 contains windings 3a, 3b which form a primary and a secondary winding of a planar transformer. The primary winding 3a and the secondary winding 3b are formed by at least one winding.

Some conductor tracks 2 are brought out bent from the plastic carrier body 1, their ends forming plug pins 4 and the plastic carrier body 1 at the same time forming the plug body 5 due to being shaped in an injection molding process.

In addition, the plastic body 1 exhibits metallized contact openings 6 and 7 which are connected to the conductor tracks 2 and which are engaged by contact pins 12 which are arranged on an aluminum carrier element 8. On the carrier element 8, a ceramic circuit board 9 is mounted which exhibits copper tracks 10. The ceramic circuit board 9, for example, is bonded to the aluminum body 8. The copper tracks 10 represent an electrical connection between the power components 11, which are also arranged on the circuit board 9, and the contact pin 12. Furthermore, the bottom part 13 of a planar transformer is arranged on the aluminum carrier element 8.

During the assembly of this two-part switched-mode power supply consisting of the plastic carrier body 1 and the aluminum carrier plate 8, the plug pins 12 of the aluminum plate 8 are introduced into the contact openings 6 and 7, respectively, of the carrier body 1. This is done in a pressing-in process, i.e. the diameter of the contact openings 6 and 7 is smaller than the thickness of the contact pins 12 so that, after the contact pins have been pressed in, a both reliable mechanical and electrical connection of the contact pin 12 to the windings 3 of the primary and secondary coils of the transformer and to the conductor tracks 2 is given.

During this assembly process, the windings 3a, 3b are introduced into the bottom part 13 of the transformer core which is open towards the top. The bottom part 13 has three webs 13a, 13b, 13c, which point in the direction of the plastic body 1, the winding 3a, 3b being arranged in the intermediate spaces 26, 27 of these webs 13a, 13b, 13c (FIG. 3a) After the plastic carrier body 1 has been pressed onto the circuit board 9, the top part 14 of the transformer core is placed onto the plastic body 1. After the reference voltage has been connected to the plug-in device 4, 5, the voltage transformed by the so-called planar transformer is thus transferred to the power components 11 via the contact pins 12.

In a particularly compact illustrative embodiment, the driving and control electronics 25 can also be arranged as component on the substrate 9. A further plug device 28, via which these electronics are communicating with other control devices via the CAN bus, is provided for use in a motor vehicle.

Figure 3B:
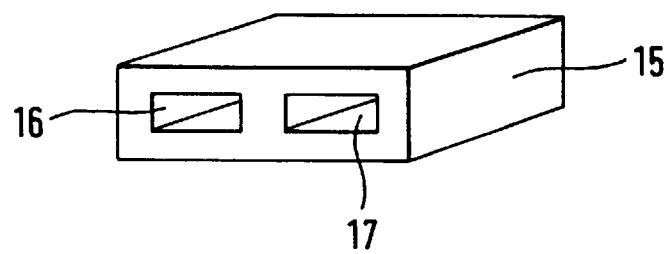

A further embodiment of the arrangement according to the invention is shown in FIG. 2. In this arrangement, the transformer core 15 is of one-piece construction and has an eight-like cross section (FIG. 3b). The transformer core 15 is pushed onto the plastic carrier body 1 and, after that, the thus preassembled plastic carrier body 1 is placed onto the aluminum plate 8, the electrical connection between plastic carrier body 1 and aluminum plate 8 being implemented by contact pins 12 in the manner already described.

Due to the fact that the transformer core 15 rests on the aluminum element 8, it is possible to operate the transformer at high powers since the aluminum plate 8 provides for adequate heat removal.

Figure 4:
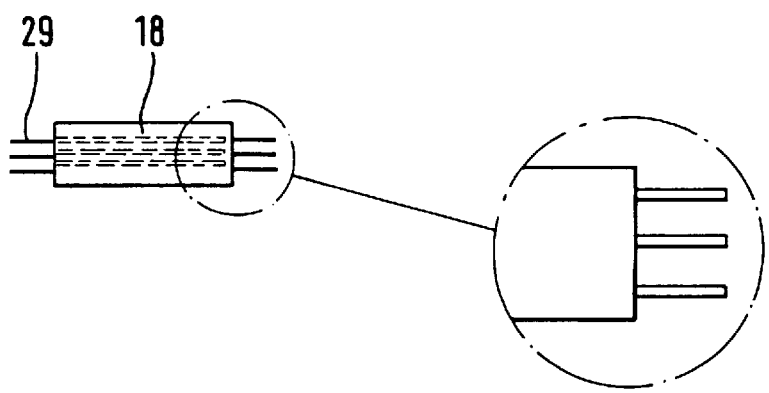
FIG. 4 shows the end part for the embodiment according to the invention according to FIG. 2.

To be able to push the transformer core 15 on, the windings of the primary winding 3a and secondary winding 3b of the transformer are interrupted as shown in FIG. 2 and protrude laterally uninsulated from the plastic carrier body 1. They are pushed through the openings 16 and 17 of the transformer core 15. After that, these windings must be electrically connected in order to ensure the operation of the transformer. For this purpose, a prefabricated end part 18, shown in FIG. 4, is pressed onto the windings 3a, 3b protruding out laterally. The end part 18 is also a plastic part in which preshaped punched sheet-metal elements 29 as already used in the plastic carrier body 1 are arranged. These conductor tracks 29 lead to an electrical connection to the windings 3a, 3b by simply placing the end element 18 on in a contacting manner.

However, the windings can also simply be welded or soldered and then insulated.

Figure 5:
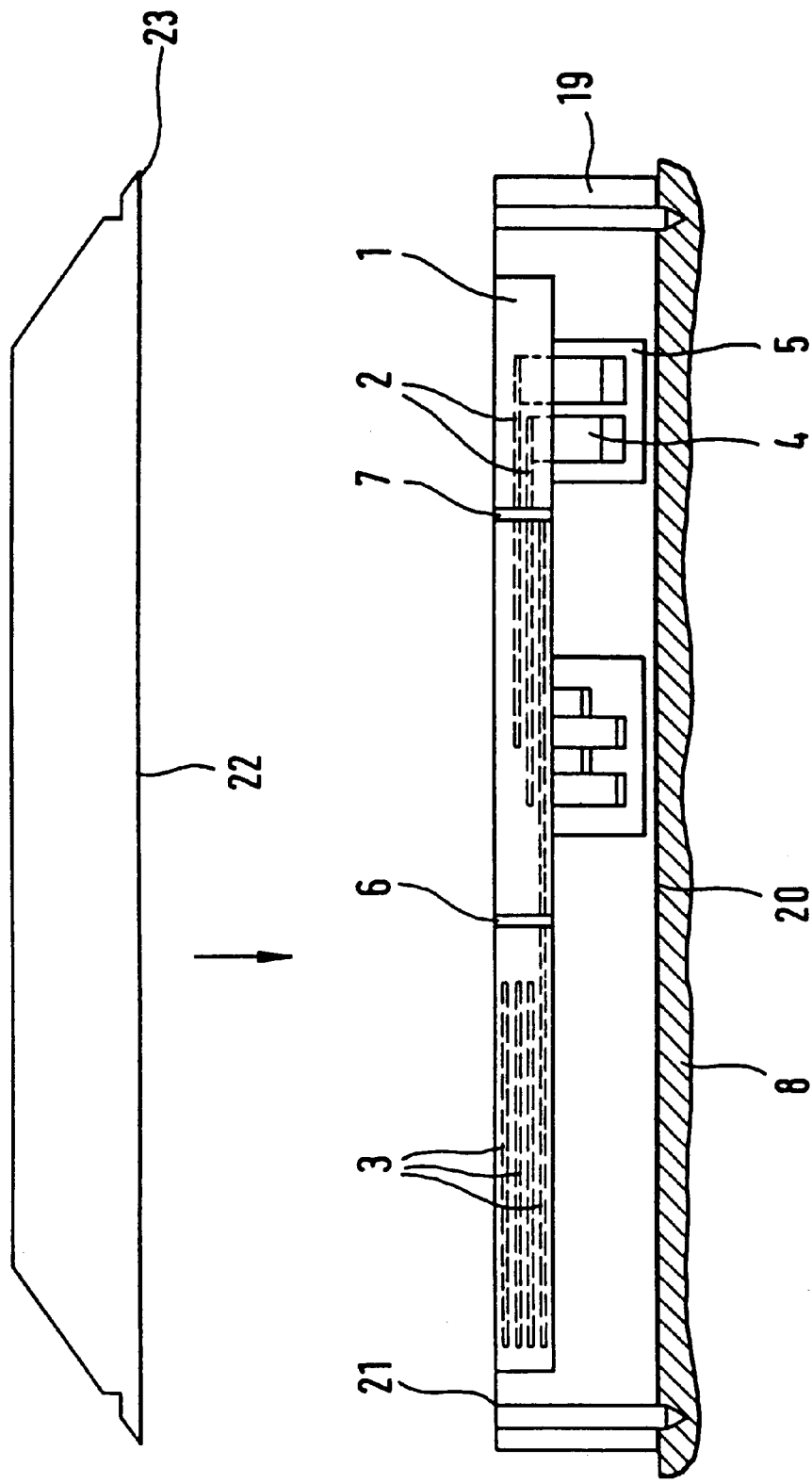
FIG. 5 shows a third embodiment of the solution according to the invention.

FIG. 5 shows an embodiment of the solution according to the invention which is particularly advantageous from the point of view of production. A housing collar 19 forming the side walls of a housing and integrally molded to the plastic carrier body 1 takes over the housing function and is formed in one process step together with the plug body 5 and plastic carrier body 1 in a plastic injection-molding process. To attach a cover 22, screws or rivets 21 are provided. In order to protect the electronics arranged in this housing 19, 22, a seal 20 which rests on the aluminum plate 8 is peripherally arranged at the collar 19.

The edge of the cover 22 also carries a seal 23 on which the plastic carrier body 1 rests. Thus, the integrally molded sealing lip bypasses possible sealing problems during the connection to the baseplate.

Figure 6:
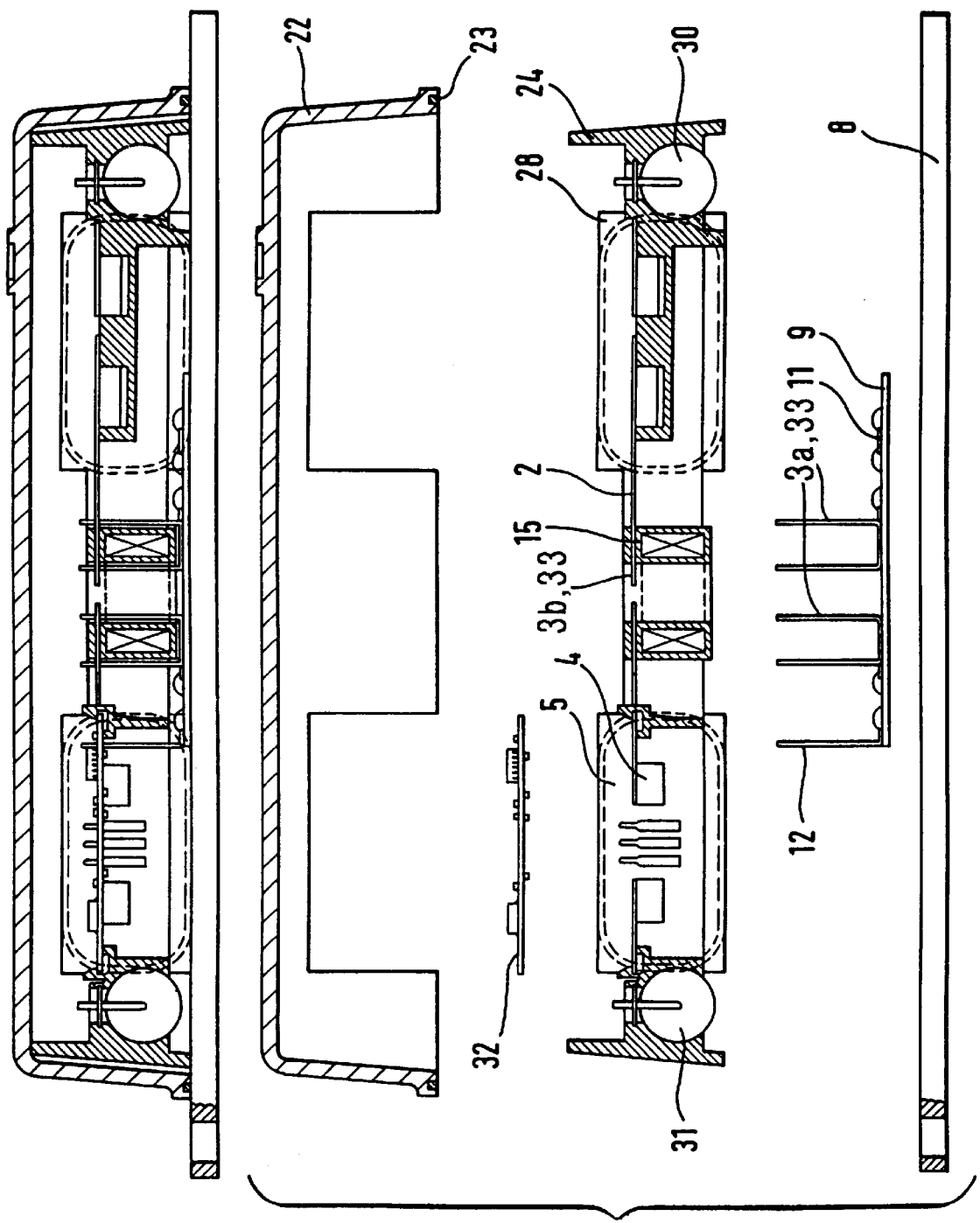
FIG. 6 shows a fourth embodiment of the solution according to the invention.

FIG. 6 shows a further embodiment. The carrier body is constructed as center part 24 of the housing. In addition to the plug devices 4,5 and 28, respectively, and the conductor tracks 2, the transformer core 15, a capacitor 30 and a choke 31 are also injection molded in the carrier body. In addition, a further electronic component 32 in the form of a circuit board carrying components is pressed onto the prefabricated center part of the housing and brought into electrical contact. The primary and secondary windings 3a, 3b are formed by individual shaped sheet-metal parts 33 which are mounted on the circuit board 9, standing away from it, and are brought into contact with the power components 11 of the circuit board 9. When the center part 24 of the housing is placed on, these shaped sheet-metal parts enclose the transformer core 15 and are electrically connected to the conductor tracks board 2, forming transformer windings.

The cover 22, which exhibits the peripheral seal 23 opposite to the carrier element 8, is constructed in the shape of a cap and screwed or riveted to the carrier element 8.

Figure 7:
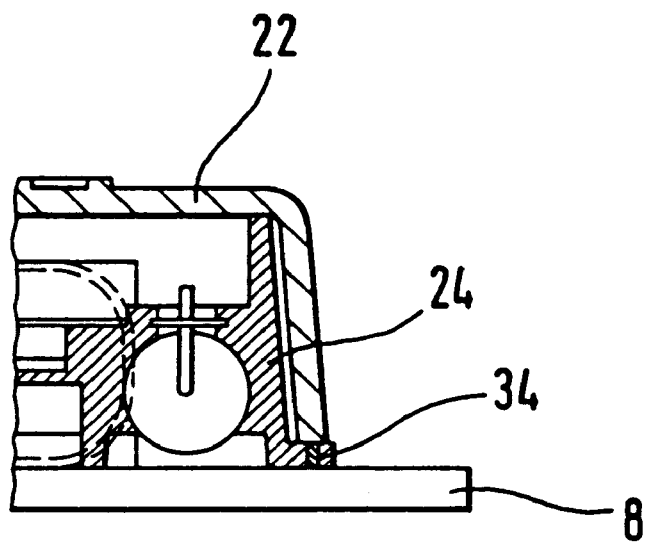
FIG. 7 shows a first seal of the electrical device.

However, the cover 22 can also rest on the center part 24 of the housing which exhibits an integrally molded seal 34 to the cover 22 and to the carrier element 8 (FIG. 7).

Figure 8:
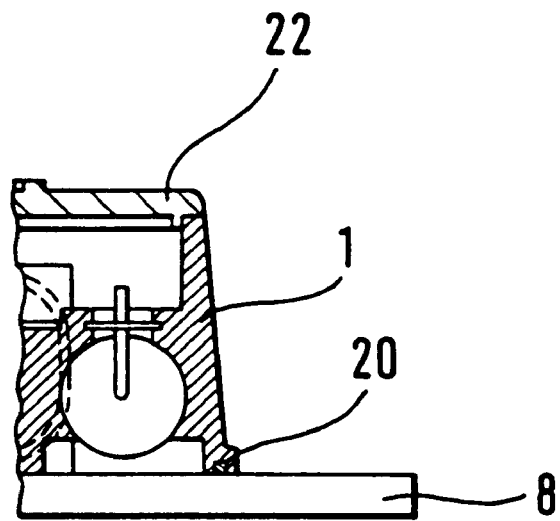
FIG. 8 shows a second seal of the electrical device.

In deviation from the device according to FIG. 5, the integrally molded seal 20 is constructed on the carrier body towards the carrier element 8. The cover 22 is tightly attached to the carrier body 1 in an ultrasonic welding process (FIG. 8).

What is claimed is:

1. A compact electrical device, especially a switched-mode power supply, comprising at least one inductance and one electrical contacting device which can be connected to a reference voltage, the inductance being connected to the contacting device via at least one first electrically conductive connection, wherein the inductance (3) and/or the first electrically conductive connection (2) and/or the contacting device (4, 5) are arranged at least partially in a carrier body (1) made of insulating material and are insulated from one another by the material of the carrier body (1), an electrical circuit (11) being connected to the first electrically conductive connection (2) of the carrier body (1) via a second electrically conductive connection (12).

2. The compact electrical device as claimed in claim 1, wherein two of said inductances arranged in the carrier body (1) are constructed as a transformer for matching different electrical voltages between the electrical circuit (11) and the contacting device (4, 5), the first electrically conductive connections (2) connecting a primary winding (3a) of the transformer to the contacting device (4, 5) and a secondary winding (3b) of the transformer to the electrical circuit (11), the primary winding (3a) and the secondary winding (3b) enclosing at least a part of a transformer core (13) of the transformer.

3. The compact electrical device, especially a switched-mode power supply, comprising a transformer for matching different electrical voltages between an electrical circuit and an electrical contacting device which can be connected to a reference voltage, at least one primary winding of the transformer being connected to the contacting device and at least one secondary winding of the transformer being connected to the electrical circuit via at least one of first electrically conductive connections, the primary and the secondary windings enclosing at least a part of a transformer core of the transformer, wherein the transformer core (15) and/or the first electrically conductive connections (2) and/or the contacting device (4, 5) being arranged in a carrier body (1) made of insulating material, the first electrically conductive connections (2) being electrically insulated from one another by the material of the carrier body (1), and the primary and secondary windings (3) of the transformer (3a, 3b, 15) being arranged on a planar carrier element (8) such that the transformer core (15) is enclosed by the windings (3a, 3b) and a second electrically conductive connection (12) being connected to the at least one first electrically conductive connection (2) of the carrier body (1), said carrier element carrying the electrical circuit (11).

4. The compact electrical device as claimed in claim 1, wherein, for forming the second electrically conductive connection, at least one contact pin (12) is arranged on a carrier element (8) for connecting the electrical circuit (11), which electrical circuit is also arranged on the carrier element (8), to one of the first electrically conductive connections (2) of the carrier body (1), which at least one contact pint (12) projects into an opening (6, 7) in the carrier body (1) electrically connected to said one of the first electrically conductive connections (2).

5. The compact electrical device as claimed in claim 4, wherein the contact pin (12) is pressed into said opening (6, 7) of the carrier body (1) for making the electrical connection.

6. The compact electrical device as claimed in claim 4, wherein ends of the first electrically conductive connections constructed as conductor tracks (2) extend out of the opening (6, 7) of the carrier body (1), protruding beyond the latter, and the contact pin (12) conducted through the opening (6, 7) is soldered together with the ends of the conductor track (2).

7. The compact electrical device as claimed in claim 6, wherein the conductor tracks (2) are constructed as shaped sheet-metal parts.

8. The compact electrical device as claimed in claim 7, wherein the shaped sheet-metal parts (2) extend out of the carrier body (1) for forming electrical connections (4) of the contacting device (4, 5), a body (5) of the contacting device (4, 5) being formed by the carrier body (1).

9. The compact electrical device as claimed in claim 1, wherein the carrier body (1) is formed for accommodation of further electrical and/or electronic components (30, 31, 32).

10. The compact electrical device as claimed in claim 9, wherein the carrier body (1) has a receptacle having latching devices for a further component (33).

11. The compact electrical device as claimed in claim 9, wherein cased or uncased electronic components (33) are arranged on an outside on the carrier body (1).

12. The compact electrical device as claimed in claim 1, further comprising a carrier element (8), and wherein the carrier body (1) is a component of a housing which covers said carrier element (8), said carrier element carrying the electrical circuit (11).

13. The compact electrical device as claimed in claim 12, wherein the carrier body (1) has a peripheral angled-away collar (19) which rests on the carrier element (8), a seal (20), which is also peripheral, being integrally molded to the collar (19).

14. The compact electrical device as claimed in claim 12, wherein the carrier body (1) is a center part (24) of the housing with said seal (20), which is injection molded on one side, for resting on the carrier element (8), the center part (24) of the housing being closed with a planar cover (22) which also has an integrally molded seal (23) for resting on the center part (24) of the housing.

15. The compact electrical device as claimed in claim 1, further comprising a carrier element (8) made of metal, preferably aluminum and simultaneously dissipates heat from the electrical circuit comprising power components (11) mounted on said carrier element.

16. The compact electrical device as claimed in claim 15, wherein the carrier element (8) carries a substrate made of copper (10) applied to a thermally conductive ceramic (9).

17. The compact electrical device as claimed in claim 2, wherein the transformer core (13, 14) is constructed of two parts, a first, E-shaped core element (13) resting on a carrier element (8) and forming three webs (13a, 13b, 13c), which webs point perpendicularly away from the carrier element (8), extending through corresponding transformer openings of the carrier body (1) and a second core element (14) which is formed planar or E-shaped, covering the webs (13a, 13b, 13c) and magnetically connecting them to one another, the primary and secondary windings (3a, 3b) being arranged to loop around between the webs (13a, 13b, 13c).

18. The compact electrical device as claimed in claim 2, wherein the primary and secondary windings (3a, 3b) of the transformer project from the carrier body (1) laterally interrupted, the transformer core (15) is formed in one-piece and has an eight-shape cross section, and is pushable over the interrupted primary and secondary windings (3a, 3b), wherein the primary and secondary windings (3), after the transformer core (15) has been pushed on, being electrically closed by a carrier body end part (18) which contains conductor tracks (29) adapted to the windings (3).

19. The compact electrical device as claimed in claim 17, further comprising a planar carrier element (8), and wherein the primary and secondary windings (3a, 3b) of the transformer are flat, and are arranged in parallel with the planar carrier element (8).

20. The compact electrical device as claimed in claim 18, wherein the primary and secondary windings (3a, 3b) of the transformer are flat, and are arranged in parallel with the carrier element (8), said carrier element being planar.

21. The compact electrical device as claimed in claim 3, wherein, for forming the second electrically conductive connection, at least one contact pin (12) is arranged on the carrier element (8) for connecting the electrical circuit (11), to said at least one of the first electrically conductive connections (2) of the carrier body (1), which at least one contact pin (12) projects into at least one opening (6, 7) in the carrier body (1), the opening being electrically connected to said at least one first electrically conductive connection (2).

22. The compact electrical device as claimed in claim 21, wherein the contact pin (12) is pressed into the opening (6, 7) of the carrier body (1) for producing the electrical connection.

23. The compact electrical device as claimed in claim 21, wherein respective ends of the first electrically conductive connections formed as conductor tracks (2) extend out of the at least one opening (6, 7) of the carrier body (1), projecting beyond the latter, and the at least one contact pin (12) projecting through the opening (6, 7) is soldered together with the respective ends of the conductor tracks (2).

24. The compact electrical device as claimed in claim 22, wherein the conductor tracks (2) are constructed as shaped sheet-metal parts.

25. The compact electrical device as claimed in claim 24, wherein the shaped sheet-metal parts (2) extend out of the carrier body (1) forming electrical connections (4) of the contacting device (4, 5), a body (5) of the contacting device (4, 5) being formed by the carrier body (1).

26. The compact electrical device as claimed in claim 3, wherein the carrier body (1) is formed so as to accommodate additional electrical and/or electronic components (30, 31, 32).

27. The compact electrical device as claimed in claim 26, wherein the carrier body (1) has a receptacle having latching devices for the additional component (33).

28. The compact electrical device as claimed in claim 26, wherein cased or uncased electronic components (33) are arranged on an outside on the carrier body (1).

29. The compact electrical device as claimed in claim 3, wherein the carrier body (1) is a component of a housing which covers the carrier element.

30. The compact electrical device as claimed in claim 29, wherein the carrier body (1) has a peripheral angled-away collar (19) which rests on the carrier element (8), a seal (20), which is also peripheral, being integrally molded to the collar (19).

31. The compact electrical device as claimed in claim 29, wherein the carrier body (1) is a center part (24) of the housing with said seal (20), which seal is injection molded on one side, for resting on the carrier element (8), the center part (24) of the housing being closed with a planar cover (22) which also has an integrally molded seal (23) for resting on the center part (24) of the housing.

32. The compact electrical device as claimed in claim 3, wherein the carrier element (8) is made of metal, preferably aluminum and simultaneously dissipates heat from the electrical circuit comprising power components (11).

33. The compact electrical device as claimed in claim 32, wherein the carrier element (8) carries a substrate made of copper (10) applied to a thermally conductive ceramic (9).

* * * * *